United States Patent
Light

(10) Patent No.: US 11,895,777 B2
(45) Date of Patent: Feb. 6, 2024

(54) FLEXIBLE INLAY AND MANUFACTURING METHOD THEREOF

(71) Applicant: IDEX BIOMETRICS ASA, Oslo (NO)

(72) Inventor: David N. Light, Exeter, NH (US)

(73) Assignee: IDEX BIOMETRICS ASA, Oslo (NO)

( * ) Notice: Subject to any disclaimer, the term of this patent is extended or adjusted under 35 U.S.C. 154(b) by 14 days.

(21) Appl. No.: 17/485,127

(22) Filed: Sep. 24, 2021

(65) Prior Publication Data

US 2023/0101831 A1  Mar. 30, 2023

(51) Int. Cl.
  *H05K 1/18* (2006.01)
  *H05K 1/03* (2006.01)
  *H05K 3/34* (2006.01)
  *H05K 3/46* (2006.01)

(52) U.S. Cl.
  CPC ........... *H05K 1/189* (2013.01); *H05K 1/0373* (2013.01); *H05K 3/3452* (2013.01); *H05K 3/3494* (2013.01); *H05K 3/4691* (2013.01)

(58) Field of Classification Search
  CPC ........ H05K 1/18; H05K 1/189; H05K 1/0373; H05K 3/3452; H05K 3/3494; H05K 3/4691
  USPC .......................................................... 361/749
  See application file for complete search history.

(56) References Cited

U.S. PATENT DOCUMENTS

| | | | |
|---|---|---|---|
| 5,674,595 A | 10/1997 | Busacco et al. | |
| 2002/0148110 A1 | 10/2002 | Blanc et al. | |
| 2008/0001759 A1 | 1/2008 | Kobayashi et al. | |
| 2008/0241563 A1 | 10/2008 | Thammasouk et al. | |
| 2018/0330221 A1 | 11/2018 | Fischer et al. | |

FOREIGN PATENT DOCUMENTS

WO   2012/014005 A1   2/2012

OTHER PUBLICATIONS

International Search Report and Written Opinion with Transmittal dated Jan. 3, 2023 in related International Application No. PCT/EP2022/076596 (15 pages).

*Primary Examiner* — Tremesha S Willis
(74) *Attorney, Agent, or Firm* — Rothwell, Figg, Ernst & Manbeck, P.C.

(57) ABSTRACT

A method for manufacturing a flex inlay is provided. The method includes providing a flexible printed circuit having opposed surfaces. The method includes attaching components to a surface of the flexible printed circuit. The method includes applying a coverlay over at least one surface of the flexible printed circuit, wherein the coverlay is patterned to not cover any components attached to the surface of the flexible printed circuit. The coverlay at least in part forms an essentially planar surface of the flex inlay.

35 Claims, 10 Drawing Sheets

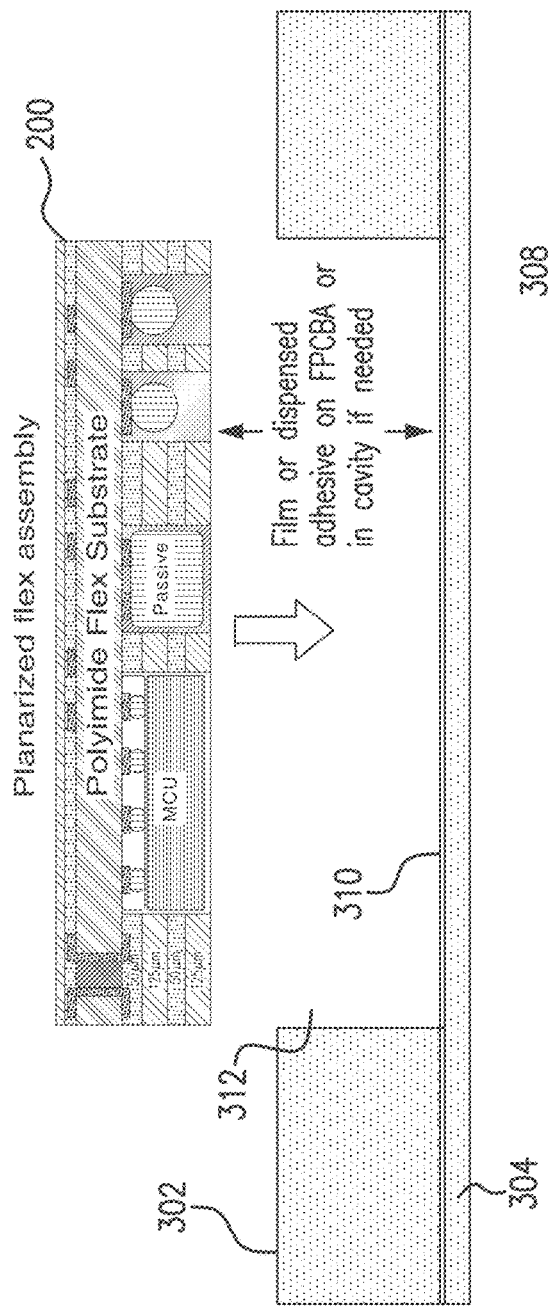
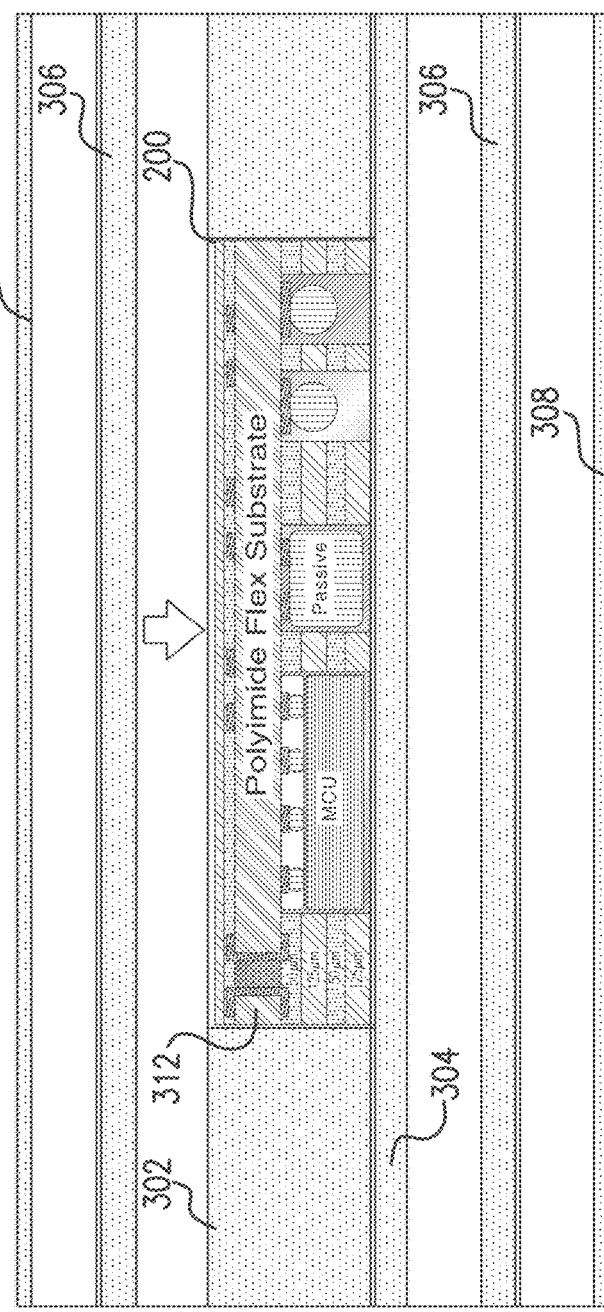
FIG. 3A
FIG. 3B

FLEXIBLE INLAY AND MANUFACTURING METHOD THEREOF

FIELD OF THE DISCLOSURE

The present disclosure relates to an improved flexible inlay and manufacturing method thereof.

BACKGROUND

A smart card, chip card, or integrated circuit card is a small, typically pocket-sized card with embedded integrated circuits. The dimensions of such a smart card may be similar to those of a credit card as specified by international standard ISO/IEC 7810. The embedded integrated circuit may provide, for example, identification, authentication, and data storage capabilities. Smart cards are therefore commonly used for access control and transaction authorization. The smart card communicates with external services via card-reading devices through contact pads on the surface of the card, referred to as contact smart cards, or wirelessly through an antenna embedded in the smart card circuitry, referred to as contactless smart cards. In addition, there are also hybrid, or dual interface, smart cards that have both contact pads and an antenna.

When a smart card is inserted into, or placed in close proximity to, a card reading device, the card reading device may request a holder of the smart card to provide a PIN or similar confirmatory input to authenticate the holder to the card reader. It has long been known that a PIN does not provide sufficient security; hence, it has been suggested to integrate biometric sensors, such as fingerprint sensors, on the smart cards.

Prior art smart cards with integrated biometric sensors require non-standard card manufacturing processing steps and include large, brittle, typically silicon, solid-state integrated circuit chips subject to breaking due to bending of the card. Hence there is a need in the art for a smart card with an integrated biometric sensor that is compatible with standard smart card manufacturing processes and capable of withstanding bending of the smart card.

SUMMARY

In view of the above-mentioned and other drawbacks of the prior art, it is an object of the subject matter described herein to provide an improved flex inlay.

The following presents a simplified summary in order to provide a basic understanding of some aspects described herein. This summary is not an extensive overview of the subject matter described herein or any claims appended hereto. It is intended to neither identify key or critical elements of the subject matter nor delineate the scope thereof. Its sole purpose is to present some concepts in a simplified form as a prelude to the more detailed description that is presented later.

According to a first aspect of the disclosure, there is provided a method for manufacturing a flex inlay. The method includes providing a flexible printed circuit having opposed surfaces. The method includes attaching components to a surface of the flexible printed circuit. The method includes applying a coverlay over at least one surface of the flexible printed circuit, wherein the coverlay is patterned to not cover any components attached to the surface of the flexible printed circuit. The coverlay at least in part forms an essentially planar surface of the flex inlay.

In some embodiments, the components comprise one or more of: an antenna, a microcontroller unit (MCU), an application-specific integrated circuit (ASIC), a passive element, an interconnection (IO) stand-off structure; and a secure element. In some embodiments, the components are attached to the surface of the flexible printed circuit with solder and/or conductive adhesive. In some embodiments, the method further includes dispensing a fill material to fill voids between the attached components and the outer surface of the coverlay, and wherein the essentially planar surface of the flex inlay is further formed by the fill material. In some embodiments, the method further includes curing the fill material, and wherein a surface of the fill material, after curing, is essentially flush with, proud of, or below a surface of the coverlay.

In some embodiments, attaching components to a surface of the flexible printed circuit occurs before applying a coverlay over at least one surface of the flexible printed circuit. In some embodiments, attaching components to a surface of the flexible printed circuit occurs after applying a coverlay over at least one surface of the flexible printed circuit. In some embodiments, an adhesive used in applying the coverlay over at least one surface of the flexible printed circuit is compatible with high temperatures (e.g. lead-free solder reflow temperatures). In some embodiments, the height of an outer surface of the coverlay above the surface of the flexible printed circuit is at least as great as the height any attached components above the surface of the flexible printed circuit. In some embodiments, the essentially planar surface of the flex inlay is fully planar. In some embodiments, one or more of the components protrudes above the essentially planar surface of the flex inlay by an amount that less than what would be feasible with a solder mask in place of the coverlay on the surface of the flexible printed circuit.

In some embodiments, attaching components to a surface of the flexible printed circuit comprises attaching components to only one surface of the flexible printed circuit. In some embodiments, attaching components to a surface of the flexible printed circuit comprises attaching components to both surfaces of the flexible printed circuit. In some embodiments, applying a coverlay over at least one surface of the flexible printed circuit comprises applying coverlay over both surfaces of the flexible printed circuit. In some embodiments, the coverlay comprises two or more layers on each of the at least one surface of the flexible printed circuit that it is applied to. In some embodiments, the coverlay comprises a film with a partially cured layer of thermoset adhesive on one surface of the film, wherein the film is made of one or more of polyimide, polyethylene terephthalate (PET), and polyethylene naphthalate (PEN).

In some embodiments, the fill material comprises one or more of (i) a material having a compressive modulus at least as great as polyvinyl chloride (PVC), (ii) a low modulus thermoset material, (iii) a modified epoxy, (iv) a modified acrylic, (v) an epoxy blend (e.g., containing fluoropolymers, silicones, or other polymers), (vi) a material that is thermally curable, UV curable, or curable by a combination of thermal and UV, (vii) a material having a flexural modulus similar to PVC, (viii) a material having a compressive modulus between 3 GPa and 10 GPa, (ix) a material having a flexural modulus between 1 GPa and 10 GPa, and (x) a material having a flexural modulus between 2 GPa and 5 GPa. In some embodiments, the flexible printed circuit has a base dielectric material comprising one or more of polyimide, polyethylene terephthalate (PET), and polyethylene naphthalate (PEN); and has a conductor material comprising one or more of copper, aluminum, and a conductive ink. In some embodiments, the method further includes applying a solder mask prior to applying the coverlay, wherein the solder mask is under the coverlay.

According to a second aspect, there is provided a flex inlay. The flex inlay includes a flexible printed circuit having opposed surfaces. The flex inlay includes components attached to a first surface of the flexible printed circuit, the first surface being one of the opposed surfaces. The flex inlay includes a coverlay over at least one surface of the flexible printed circuit, wherein the coverlay is patterned to not cover any components attached to the first surface of the flexible printed circuit. The coverlay at least in part forms an essentially planar surface of the flexible printed circuit.

Further features of, and advantages with, the present disclosure will become apparent from the following description. The skilled person will realize that different features of the present disclosure may be combined to create embodiments other than those described in the following, without departing from the scope of the present disclosure.

BRIEF DESCRIPTION OF THE DRAWINGS

The accompanying drawings, which are incorporated herein and form part of the specification, illustrate various examples of the subject matter of this disclosure. In the drawings, like reference numbers indicate identical or functionally similar elements.

FIGS. 3A and 3B illustrate a flex circuit assembly being embedded into prelaminated inlay and card according to embodiments.

DETAILED DESCRIPTION

Figure 1:
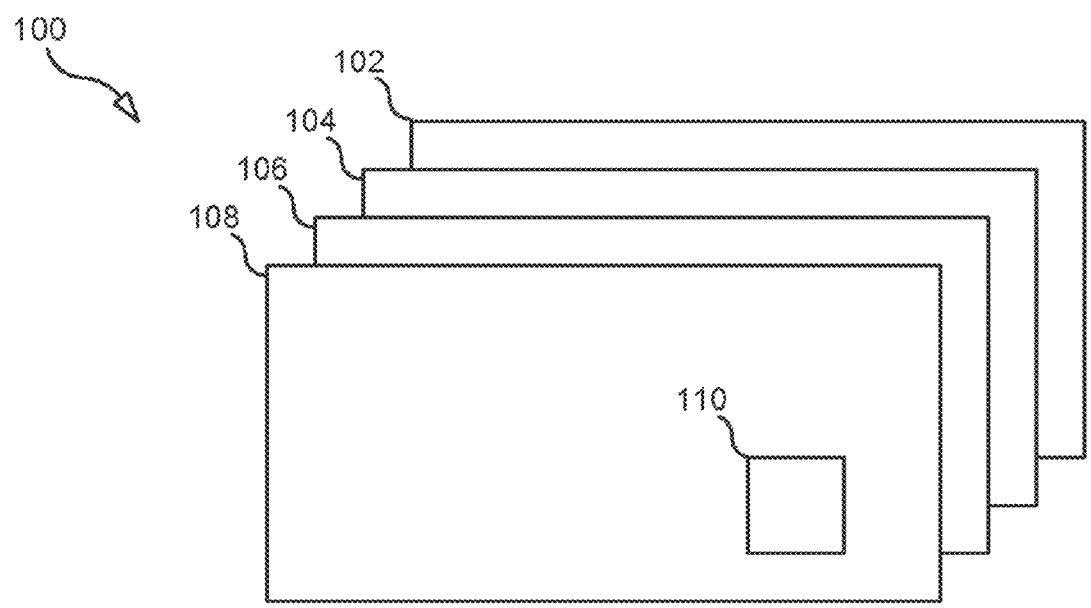
FIG. 1 illustrates an exploded view of a multi-layer smart card according to an embodiment.

While aspects of the subject matter of the present disclosure may be embodied in a variety of forms, the following description and accompanying drawings are merely intended to disclose some of these forms as specific examples of the subject matter. Accordingly, the subject matter of this disclosure is not intended to be limited to the forms or examples so described and illustrated.

Unless defined otherwise, all terms of art, notations and other technical terms or terminology used herein have the same meaning as is commonly understood by one of ordinary skill in the art to which this disclosure belongs. All patents, applications, published applications and other publications referred to herein are incorporated by reference in their entirety. If a definition set forth in this section is contrary to or otherwise inconsistent with a definition set forth in the patents, applications, published applications, and other publications that are herein incorporated by reference, the definition set forth in this section prevails over the definition that is incorporated herein by reference.

Unless otherwise indicated or the context suggests otherwise, as used herein, "a" or "an" means "at least one" or "one or more."

This description may use relative spatial and/or orientation terms in describing the position and/or orientation of a component, apparatus, location, feature, or a portion thereof. Unless specifically stated, or otherwise dictated by the context of the description, such terms, including, without limitation, top, bottom, above, below, under, on top of, upper, lower, left of, right of, in front of, behind, next to, adjacent, between, horizontal, vertical, diagonal, longitudinal, transverse, radial, axial, etc., are used for convenience in referring to such component, apparatus, location, feature, or a portion thereof in the drawings and are not intended to be limiting.

Furthermore, unless otherwise stated, any specific dimensions mentioned in this description are merely representative of an example implementation of a device embodying aspects of the disclosure and are not intended to be limiting.

To the extent used in this disclosure or in any claims claiming priority to this disclosure, the term "about" applies to all numeric values specified herein, whether or not explicitly indicated. This term generally refers to a range of numbers that one of ordinary skill in the art would consider as a reasonable amount of deviation to the recited numeric values (i.e., having the equivalent function or result) in the context of the present disclosure. For example, and not intended to be limiting, this term can be construed as including a deviation of ±10 percent of the given numeric value provided such a deviation does not alter the end function or result of the value. Therefore, under some circumstances as would be appreciated by one of ordinary skill in the art a value of about 1% can be construed to be a range from 0.9% to 1.1%.

To the extent used in this disclosure or in any claims claiming priority to this disclosure, the term "adjacent" refers to being near or adjoining. Adjacent objects can be spaced apart from one another or can be in actual or direct contact with one another. In some instances, adjacent objects can be coupled to one another or can be formed integrally with one another.

To the extent used in this disclosure or in any claims claiming priority to this disclosure, the term "proximate" refers to being near, adjoining, or separated by a relatively or functionally small distance or space. For example, a first object that is proximate to a second object can be in contact with the second object or can be within a distance of the second object such that the distance or space from the first object to the second object allows for the two objects to serve their respective functions or exhibit their respective characteristics in accordance with this disclosure.

To the extent used in this disclosure or in any claims claiming priority to this disclosure, the terms "substantially" and "substantial" refer to a considerable degree or extent. When used in conjunction with, for example, an event, circumstance, characteristic, or property, the terms can refer to instances in which the event, circumstance, characteristic, or property occurs precisely as well as instances in which the event, circumstance, characteristic, or property occurs to a close approximation, such as accounting for typical tolerance levels or variability of the examples described herein.

To the extent used in this disclosure or in any claims claiming priority to this disclosure, the terms "optional" and "optionally" mean that the subsequently described, component, structure, element, event, circumstance, characteristic, property, etc. may or may not be included or occur and that the description includes instances where the component, structure, element, event, circumstance, characteristic, property, etc. is included or occurs and instances in which it is not or does not.

All possible combinations of elements and components described in the specification or recited in any claims supported by this disclosure are contemplated and considered to be part of this disclosure. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

To the extent used in this disclosure or in any claims claiming priority to this disclosure, the term "including" is used as the plain-English equivalent of the respective term "comprising." The terms "comprising" and "including" are intended herein to be open-ended, including not only the recited elements, but further encompassing any additional elements. Moreover, in any claims supported by this disclosure, the terms "first," "second," and "third," etc. are used merely as labels, and are not intended to impose numerical requirements on their objects.

Smart cards are typically manufactured by having different layers. For example, the smart card 100 shown in FIG. 1 may include a back side overlay 102, a back side layer 104, an inlay 106, and a front side layer 108. Card 100 may also include, for instance, a fingerprint sensor 110. A typical fingerprint sensor module utilizes solder balls, electrically conductive adhesives, or anisotropic electrically conductive adhesive films as interconnections from the fingerprint sensor module to the application host, e.g., smart card. Card 100 may be made by laminating the different layers together, e.g., using a hot lamination process or a cold lamination process.

In the context of the present disclosure, a "fingerprint sensor" or "sensor element" may comprise an arrangement of one or more components configured to produce a signal based on a measurable parameter (e.g., capacitance, light/optics, heat/thermal, pressure, etc.), characteristics of which will vary based on the presence or absence of an object that is in local proximity to the sensor element. A fingerprint sensor will comprise an array of such sensor elements configured to produce a signal based on a portion of the surface of a finger placed on or near the fingerprint sensor. The sensitivity of each of the sensor elements of the fingerprint sensor is such that characteristics of the signal produced at each sensor element will vary based on surface features of the portion of finger placed on or near the array, and the varying characteristics of signals produced at each sensor element may be combined or otherwise processed to form a data file with an actual or virtual "image" of the fingerprint of the portion of the finger surface placed on or near the array.

Specific examples of such sensor elements may include, but are not restricted to, capacitive, optical, thermal, and pressure sensor elements. As an illustrative example, two types of capacitive sensor elements that may be employed in a fingerprint sensor are mutual capacitance sensor elements and self-capacitance sensor elements. An array of mutual capacitance sensor elements comprises a plurality of spaced apart drive lines and a plurality of spaced apart pickup lines arranged transversely to the drive lines and spaced from the drive lines by a dielectric material. Each intersection of the pickup lines and the drive lines constitutes a mutual capacitance sensor element configured to produce a signal indicative of a capacitance change due to the presence or absence of a portion of an object that is in local proximity to the mutual capacitance sensor element. An array of self capacitance sensor elements comprises a first plurality of spaced apart conductive lines and a second plurality of spaced apart conductive lines arranged transversely to the first plurality of spaced apart conductive lines. Each conductive line of the first and second plurality of conductive lines is configured to transmit a signal to the finger surface placed in detectable proximity and receive a resultant signal. Accordingly, each conductive line constitutes a self-capacitance sensor element configured to produce a signal indicative of a capacitance change due to the presence or absence of a portion of an object that is in local proximity to the self capacitance sensor element.

In addition, sensor elements contemplated herein include both silicon-based sensors in which sensor elements are formed directly on a silicon semiconductor substrate and may form a 2-dimensional array of sensing pixels and off-silicon sensors in which sensor elements are not disposed directly on a silicon semiconductor substrate (e.g., so-called off-chip sensors) but formed on a non-silicon substrate and are conductively connected to a remotely-located control element, which may be a silicon-based semiconductor chip, such as an application specific integrated circuit (ASIC).

While aspects of this disclosure may be presented in the context of specific types of sensor elements and fingerprint sensor configurations, it should be appreciated that implementations of those aspects are not necessarily limited to specific types of sensor elements of fingerprint sensors described herein.

Exemplary features of a fingerprint sensor with overlapping drive lines and pickup lines as well as the drive, sense, and scanning electronics, are discussed in U.S. Pat. No. 8,421,890, entitled "Electronic imager using an impedance sensor grid array and method of making," U.S. Pat. No. 8,866,347, entitled "Biometric sensing", and U.S. Pat. No. 9,779,280, entitled "Fingerprint Sensor Employing an Integrated Noise Rejection Structure," the respective disclosures of which are incorporated by reference in their entirety. Further improvements and enhancements to the devices, methods, and circuitry used to improve the sensitivity of the measurement principal employing a sensor grid comprised of overlapping drive lines and pickup lines separated by a dielectric including the drive, sense, scanning, and noise reduction electronics, are also described in U.S. Pat. No. 9,779,280.

In some embodiments, an OLED display may operate as the fingerprint sensor. Exemplary embodiments of the OLED display configured to operate as a fingerprint sensor are described in U.S. Pat. No. 10,101,851, entitled "Display with Integrated Touch Screen and Fingerprint Sensor," the disclosure of which is incorporated by reference in its entirety.

The inlay 106 may be made of a flexible material (such as a flexible printed circuit board (PCB), also referred to here as a "flex circuit" or "flex"), and may include a number of circuitry related elements, such as antennas, microcontroller units (MCUs) or application-specific integrated circuits (ASICs), passive elements, interconnection (IO) stand-off structures such as solder domes or surface mounted metal plates, and so on. In some embodiments described herein, the flex circuit comprises a fingerprint sensor, and thus the flex circuit may be referred to herein as a fingerprint circuit assembly, or more generally as a flexible printed circuit assembly (FPCA). For example, inlay 106 may have circuitry that is configured to form a fingerprint "image" and match the fingerprint "image" to a pre-stored template. In some embodiments, a fingerprint sensor (if present) or other sensor may be a separate structure from the FPCA, and the fingerprint sensor or other sensor may be embedded into card 100 and interconnected to the flex circuit inlay after milling a cavity (e.g. with a anisotropic conductive film (ACF)). The inlay 106 typically has a three-dimensional topography on one or both surfaces (i.e., top and bottom surfaces of the inlay 106), which may include the circuitry related elements just described. This topography complicates the manufacturing process of card 100, and, in particular, the manufacturing of the inlay 106 (or "prelaminated inlay" or "prelam layer" or, simply, "prelam"). For instance, with a standard prelam hot lamination process, involving application of heat and pressure, IO stand-off structures such as solder domes or metal plates are pushed downward, so that their tops are nearly coplanar with the flex surface. This provides minimal accommodation of cavity milling depth tolerances during card manufacturing. Additionally, components on the surface of the FPCA can be damaged from the applied pressure during lamination (e.g., PVC lamination). Also, the surface of the prelam is not completely flat as a result of the varied topography of the inlay 106. Because of this, an x-, y-dimensional shift occurs as material (e.g., PVC) flows non-uniformly to accommodate the topography. Additionally, the varied topography of the inlay 106 may result in a non-planar surface on the finished card, which is undesirable cosmetically and which subjects the three-dimensional structures on the FPCA (e.g. the ASIC and the passive components) to higher probability of damage during card handling and use.

One approach described herein for addressing integration challenges caused by the three-dimensional topography on one or both surfaces of the inlay 106 is to create a custom stack-up of layers (e.g., PVC layers). These layers may include milled or punched openings to act as clearance recesses for the flexible inlay 106, including the solder domes and other components. The cavities formed thereby may later be filled after forming the layers (e.g., PVC layers). During manufacturing, this approach will add some amount of cost and stacking of the card layers during card manufacturing (i.e. the layup process) becomes more complex.

Another approach described herein is to move some, or most, or all of the personalization processes to address the FPCA topography to the FPCA fabrication process itself, using predominately standard processes and materials.

Many flexible inlay circuits are manufactured with a coverlay material on the surface in lieu of a solder mask. Coverlay is commonly a polyimide film with an adhesive (typically modified acrylic adhesives, modified polyester adhesives, or epoxy adhesives) on one side. The adhesive may be B-staged by the coverlay manufacturer (i.e., partially cured, so as to be minimally tacky, and bondable to the flexible printed circuit (FPC) substrate). The adhesive may be a low flow material (e.g., lateral flow (squeeze-out) into openings typically less than 100 μm per 25 μm thickness), so thinning at lamination is minimal. Medium flow and high flow adhesives are also available. Other flexible polymer materials may be used as coverlay materials, such as PET (polyethylene terephthalate) and PEN (polyethylene naphthalate) films with an adhesive on one side. These materials are typically lower cost than polyimide. They can be used with similar adhesives on one side (e.g. modified acrylic, modified polyester, or epoxy adhesives). PET and PEN typically do not have sufficient thermal stability to withstand soldering processes (e.g. SMT) with lead-free or eutectic solder when attaching components. For this reason, SMT on PET or PEN substrates may make use of conductive adhesives, or use of low temperature (e.g. bismuth alloy or indium alloy) solders, to surface mount components on the flex inlay. However, if the coverlay is applied to the FPCA after SMT assembly of components instead of before, the PET and/or PEN coverlay materials may be adequate for this application even when lead-free or eutectic SnSb solders are used. The coverlay is commonly used in place of a solder mask, and can serve several functions including protection of the FPCA circuit traces from damage and oxidation, and acting as a solder dam when attaching surface mount components, while providing certain advantages such as greater flexibility and fatigue resistance than typical solder mask materials.

Coverlay materials are available which can be significantly thicker than solder mask materials. In one embodiment of the present invention, coverlay films are utilized on one or both sides of the FPCA in place of a solder mask. In a further embodiment, the coverlay film thickness after lamination to the FPC is sufficient to stand proud of any components, devices, or IO stand-off structures assembled to the FPC prior to or after lamination of the coverlay, such that these elements are recessed beneath, or flush with, the surface of the coverlay. In this way, the coverlay can protect the structures (components, devices, IO stand-offs, etc.) on the FPCA during card lamination, and protect the IO stand-offs from being displaced downward from the FPC surface on which they are attached. The coverlay can also enable a predominately planar FPCA surface, which can simplify the card manufacturing process and produce a card with better cosmetic appearance.

These coverlay materials are manufactured by numerous material companies, including DuPont, Sheldahl, Taiflex Scientific Co., Ltd., Innox Advanced Materials Company, Arisawa Mfg. Co., Ltd., and others. DuPont standard coverlay materials are in a product family known as Pyralux®, and in some cases include a proprietary modified acrylic adhesive on one side of a DuPont polyimide film such as Kapton HN. A flame retardant version (FR) and a standard version (LF) of the Pyralux® adhesives are available.

To layer the coverlay over the FPCA, the coverlay (polyimide-adhesive stack) may be pre-patterned (e.g., punched, laser cut, or machined) to create clearance openings of the appropriate dimensions and locations, and then laminated to the surfaces of the FPCA. This process can be quite precise, including pin or optical alignment at patterning and lamination. Photosensitive coverlay materials are also available, whereby the insulating film (e.g. polyimide) and the adhesive can be patterned simultaneously after lamination to the FPC using photolithographic processes (e.g. patterned UV light exposure and chemical development).

Coverlay processing is typically done at the panel level before singulation of the flex circuits, so has the advantages of batch/parallel processing. In the case of roll-to-roll manufacturing of FPCs, coverlay materials can be and typically are applied in roll-to-roll format.

DuPont Pyralux® coverlay, and other manufacturers' coverlay materials, come in a variety of thicknesses: Adhesive thickness commonly ranges from 13 μm to 75 μm, although thinner and thicker adhesives may be available; Kapton® polyimide thickness may range from 13 μm to 127 μm. Other coverlay manufacturers may offer thinner and thicker polymer films (polyimide, PET, PEN, etc.). In the case of the solder domes on the flex at the EMV (or secure element module) and sensor module sites, a 75 µm dome height above the polyimide could be accommodated by Pyralux® LF (or FR) 0120, having 25 µm adhesive thickness and 50 µm polyimide thickness, or possibly 0130 (25 µm adhesive, 75 µm polyimide, the greater thickness to accommodate tolerance of the solder dome height and any compression of the coverlay adhesive that may occur during the lamination process). Punched or laser cut openings in the coverlay may be created before lamination (coverlay is very compatible with UV laser machining and mechanical punching with hard (such as punch and die sets) or soft tooling (e.g. steel rule or chemically milled dies such as those offered by Shenzhen YueBaixiang Technology Co., Ltd., and Atlas Die, LLC (including their Eagle™ die and rotary die)). Photosensitive coverlay materials may be patterned after lamination using photolithographic processes, although these are typically thinner than the laminated film coverlay materials.

On the component side of the FPCA, in one embodiment the tallest component is about 330 µm nominal height (or thickness). In that case, a single layer of DuPont Pyralux® coverlay is not available in standard thicknesses that would be thick enough to exceed the component thickness. A stack of two layers of pre-patterned (e.g., punched or laser cut) coverlay might be required to match or exceed the heights of these components. These layers could be laminated to the flex circuit assembly simultaneously, and at the same time as the coverlay on the opposite side of the flex circuit, if present (alternatively, a solder mask may be used on the opposing surface). Coverlay pre-patterning and registered layup and lamination are standard processes in flex manufacturing. Alternatively, two layers of coverlay could be bonded together by the coverlay manufacturer or the FPC manufacturer prior to lamination to the FPC. Also, other coverlay manufacturers may offer thicker coverlay films than DuPont, whereby a single layer of coverlay may provide sufficient thickness such that the components and IO stand-offs are recessed beneath, or flush with, its surface after lamination. It is also possible that for very high volume applications, coverlay suppliers would offer custom thicknesses including the thicker films required for cases where components on the flex are quite tall. Two layers of Pyralux® LF or FR 0250 (51 µm adhesive and 127 µm polyimide each) would provide about 350 µm height clearance. If this overall FPCA stack-up is too thick for a specific biometric smart card design, the flex could potentially be re-designed to have the components and solder domes or IO stand-off plates on the same side, reducing total thickness by about 75 µm to 100 µm. Alternatively, the micro ball grid array (µBGA) MCU, if present, could be attached through solder ball openings in the flex polyimide to back side metal, reducing stand-off (as in FIG. 6). In addition, lower profile passive components could be sourced.

In one embodiment, the flex has all components and I/O pads on one side. This structure may require greater standoff of I/O pads from the flex surface to be located close enough to the card surface in the card assembly for access via milling and to accommodate sensor embedding (e.g., see FIGS. 7A and 7B), depending on the thickness of the sensor at its attachment area to the card. For example, the component height may be in the range of 250 µm-350 µm or more. The IDEX fingerprint sensor (FPS) substrate is commonly about ~250 µm in thickness. Pads on the perimeter of the FPS substrate must connect to I/O pads on the flex inlay buried within the card body, which are exposed when milling the cavity for the FPS in the finished card. In embodiments, the sensing surface of the embedded FPS should be flush with the card surface, or slightly recessed below it. That means that the contact pads on the FPS must ideally be about ~250 µm from the surface of the card. The components on the FPCA must be buried within the card, and typically must be below the printed layer of the card (which itself is commonly 125 µm thick), so the FPCA surface may be >375 µm deep within the card—deeper than the FPS substrate can be if the sensing surface is to be approximately flush with the card surface. In embodiments, metal posts or plates are surface mounted (soldered or attached with conductive adhesive) onto the I/O pads on the FPCA, so that the pads protrude well above the FPCA surface. When the cavity for the FPS is milled into the card, it reaches and mills partway into these plates, exposing them, and enabling the cavity depth to be approximately equal to the thickness of the FPS substrate.

In another embodiment, the tallest structures (components, devices, or IO structures, etc.) protrude somewhat above the surface of the coverlay, but is reduced or minimized compared to what would be feasible with a solder mask in place of the coverlay on the FPCA surface, and the height differential is small enough that component and/or device damage and excessive z-axis displacement of these surface mounted structures during card manufacturing are prevented, and the card appears acceptable cosmetically.

Figure 2A:
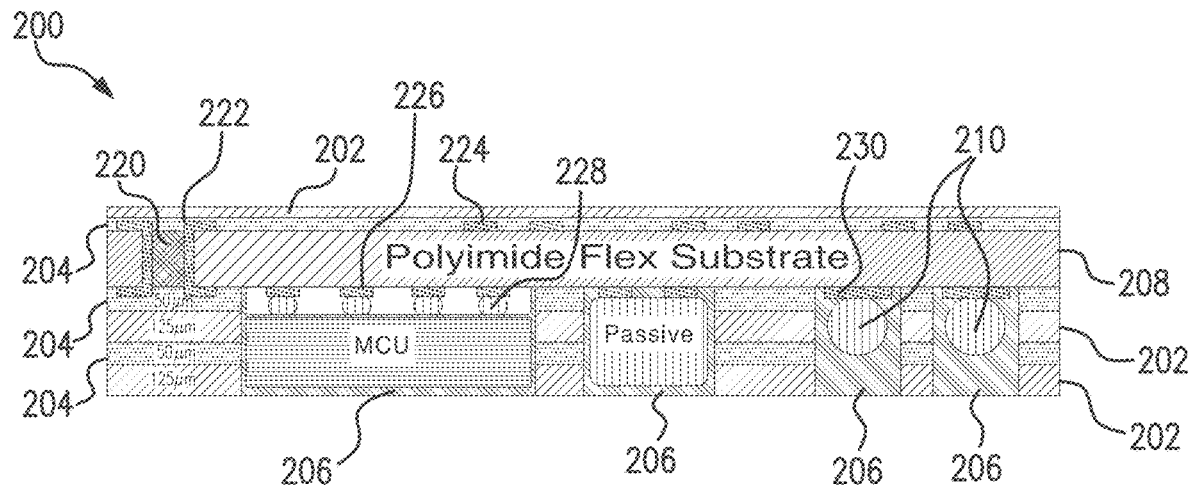
FIGS. 2A, 2B, and 2C illustrate a transverse cross-section of a flex circuit assembly according to embodiments.
Figure 2B:
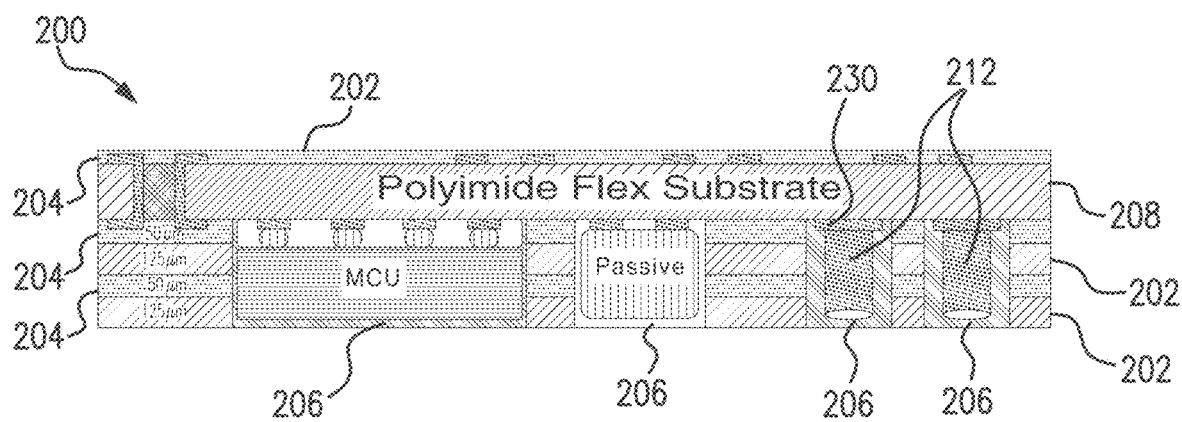

FIGS. 2A and 2B show a two metal layer flex substrate with components assembled on a single side according to an embodiment. In FIG. 2A, the structure is shown with an I/O pad 230 and solder ball standoff 210. In FIG. 2B, the structure is shown with a SMT copper plate (post) 212 standoff.

A planarized flex circuit assembly 200, such as shown in FIGS. 2A and 2B, may be manufactured by a flexible printed circuit assembly (FPCA) manufacturer for use in a card, as some flex circuit substrate manufacturers offer assembly services as well. The configuration shown has I/O pads 230 and all components, such as the MCU and passive components (such as such as capacitors, inductors, resistors, etc.), on one side of a flex substrate 208 (e.g., a polyimide flex substrate, a PET flex substrate, or a PEN flex substrate) with conductive circuit elements on one or both sides. Alternatively, the flex circuit substrate, including coverlay structures, may be manufactured by a flexible printed circuit (FPC) manufacturer, and the components assembled to the FPC by an outsourced assembly and test (OSAT) manufacturer. The flex assembly (FPCA) 200 is essentially fully planarized prior to embedding it in the card prelam. By essentially fully planarized, the assembly 200 is either fully planarized, or the height differential for structures protruding above the surface of the coverlay is small enough that component and/or device damage and excessive z-axis displacement of these surface mounted structures during card manufacturing may be avoided, or the components are slightly recessed from the coverlay surface. If desired or required to improve robustness or ability to process the FPCA during card manufacturing, an encapsulant may be dispensed by the FPCA manufacturers or OSAT after assembly to encapsulate the components, devices, and/or 10 structures. As shown in these figures, all components are on one side of a flex substrate 208, but it should be understood that in other embodiments there may be components on either side of the flex substrate 208, and the planarized FPCA concept is applicable to both sides of the circuit assembly.

The planarized FPCA may be embedded in a single cavity in a single layer of the card prelam structure (e.g. a layer of PVC, PC, PET, etc.) without requiring a subsequent cavity fill (e.g., as shown in FIGS. 3A and 3B). An adhesive may be used to enhance bonding to the card cavity, such as a film or dispensed adhesive. In some cases, adhesion of the FPCA to the card material may be sufficient without use of an adhesive between the FPCA and the card material. As shown, the planarized flex circuit assembly 200 may include one or more coverlay polymer film layers 202, one or more coverlay adhesive layers 204, and optional component encapsulation material 206 (e.g., encapsulant). Coverlay with respect to flexible printed circuits (FPCs) typically has a polymer film layer and an adhesive layer attached to it as supplied by the coverlay manufacturer. As such, it is generally an integral 2 layer structure as supplied to the FPC manufacturers. The film itself is typically a fully cured thermoset and can't be bonded to an FPC without the adhesive layer. The adhesive layer is generally a thermoset material that is only partially cured (i.e. 'B-staged'), so that it can be subsequently laminated and bonded to an FPC. The polymer film is commonly polyimide, and the adhesive is commonly a modified acrylic (B-staged), an epoxy (B-staged), etc. They are normally attached with heat and pressure, and the adhesive softens, flows around and conforms to printed circuit traces on the FPC, and bonds to the traces and the FPC substrate as it hardens and fully cures.

The flex circuit assembly 200 may include one or more vias 220, structures to interconnect circuits on one side of the flex substrate 208 to circuits on the other side, e.g. in the embodiment where it is a two-metal layer flex circuit. Vias 220 may be a plated through hole (PTH), as shown, or a plated blind via. In many cases, the PTH may be 'plated shut'—i.e., the opening shown in this figure may be filled with copper from the plating process. Plated copper and/or metal foil 222 is provided on either side of via 220 and partially on the surfaces of the flex substrate 208. Circuit elements 224, 226 patterned on the "top" (224) and "bottom" (226) sides of flex substrate 208 may provide electrical connection to one or more components. Typically circuit elements 224, 226 include copper circuits, although aluminum circuits (particularly in the case of a single metal layer flex circuit) and other material types are also possible. Special processes may be needed for interconnection of the circuits on the opposing sides of the flex circuit when aluminum conductors are used in the case of two or more metal layers on the flex substrate 208, as well as for the assembly of components to the aluminum if soldering is used (alternatives for direct attachment to aluminum include conductive adhesives or films). Solder balls 228 may be used in the instance where one of the components, e.g. the microcontroller unit (MCU), if present, is a BGA (ball grid array) structure (e.g. a micro-BGA WL-CSP (wafer level chip scale package)).

IO pads 230 may also be provided. These IO pads 230, for example, may provide interconnection to the fingerprint sensor or EMV module (secure element module/contact plate), or to other components. The solder balls or domes 210 or the copper plates/posts 212 can be attached to the IO pads 230 (SMT solder or otherwise) to provide the necessary stand-off so the EMV module and FPS can be embedded to the correct depth so that their top surfaces are approximately flush with the top of the cards, and also the stand-offs accommodate the depth tolerance of the milling of the cavities in the card for embedding of the EMV module and FPS.

Figure 2C:
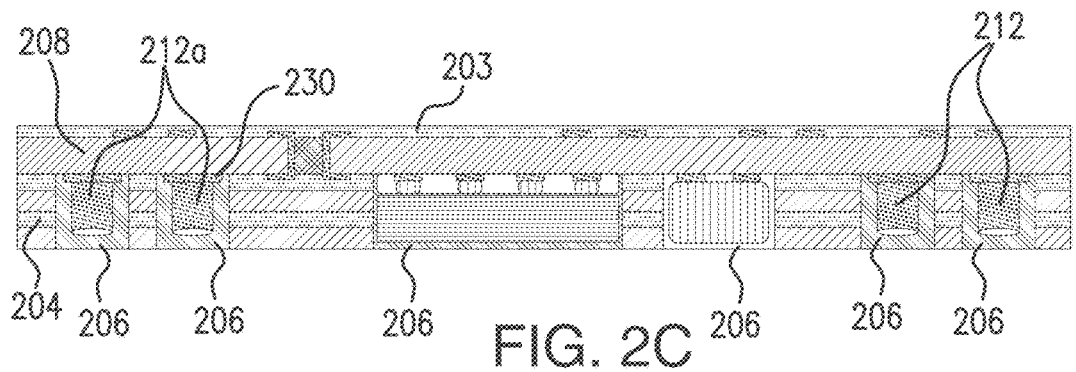

FIG. 2C shows a single-sided FPCA according to an embodiment, similar to that shown in FIGS. 2A and 2B. In this embodiment, the flex circuit assembly 200 also includes an additional set of I/O pads 230 and SMT copper plate (post) 212a standoffs, e.g. that may be used for an EMV module or FPS. Solder mask 203 is located in this embodiment on the side of the flex substrate 208 that does not include components.

FIG. 3A shows a planarized circuit flex assembly 200 being embedded in a prelam 302 according to an embodiment. FIG. 3B shows a prelam containing a planarized flex circuit assembly being embedded in a smart card according to an embodiment. As shown, the planarized flex circuit assembly 200 may be placed in a cavity 312 in a patterned prelamination layer 302. Prelamination layer 302 (e.g., about 410 µm thick) may be disposed over non-patterned prelamination layer 304 (e.g., about 80 µm thick). The assembly 200 may, in some embodiments, be secured in the cavity 312 with an adhesive 310, which is selected to bond strongly to both the card body material (commonly PVC) and the module surface (solder mask, coverlay, etc.), and which may be placed on the cavity or on the assembly 200, or alternatively it may be directly bonded to the PVC at the base of the cavity during lamination of the prelam layers. Following the embedding of the assembly 200 into the cavity of prelamination layer 302 (shown in FIG. 3A), the assembly 200 may be further embedded into the smart card (shown in FIG. 3B). For example, the assembly 200 and the prelamination layers 302 and 304 may be sandwiched between printed layers 306 (e.g., about 120 µm thick). Printed layers 306 may include logos or designs that are visible on the card, e.g. an issuer logo (MasterCard, Visa), designs, and so forth such as may be visible on a typical credit card. There are multiple printing methods for printed layers 306. Typically credit cards and many ID cards will have printed layers, while building access cards and other types of cards may not have such layers. There may be an overlay 308 (e.g., about 40 µm thick) placed over the printed layers 306 or prelamination layers 302 and 304. The printed layers 306 and/or overlay 308 may comprise one or more of PVC, PET, polycarbonate (PC), or other appropriate polymer films or sheets, with PC typically being used in high end cards due to higher cost. The assembly 200 is compatible with either a hot or cold lamination process during prelam and card fabrication. Adhesive may be needed for cold lamination processes to bond the planarized FPCA to the card layers.

The flex assembly 200 may be electrically connected to the card circuitry, e.g., through IO pads 230 and standoffs 210, 212.

Figure 4:
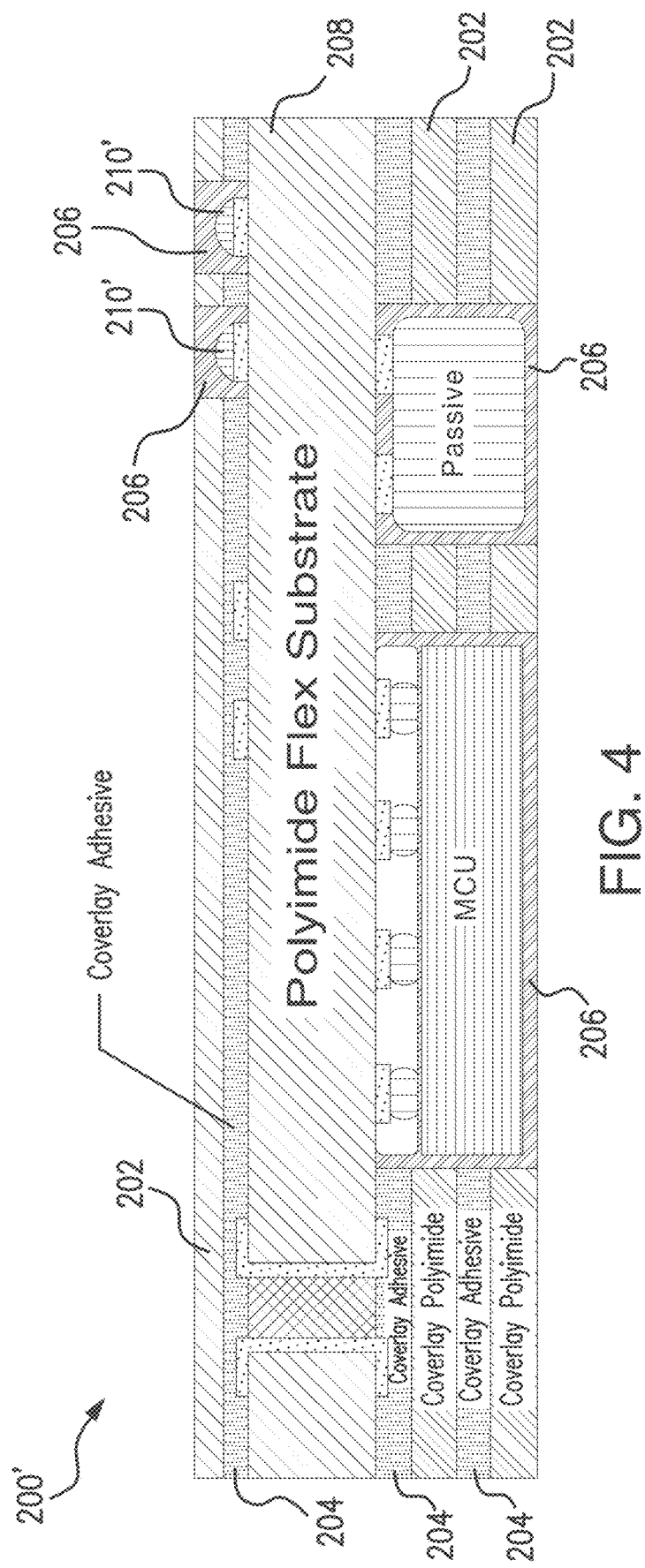
FIG. 4 illustrates a transverse cross-section of a flex circuit assembly according to embodiments.

FIG. 4 shows a planarized flex circuit assembly according to an embodiment. The assembly 200' shown in FIG. 4 is similar to that shown in FIGS. 2A and 2B, with the difference being that the circuitry components are on a single side in FIGS. 2A and 2B and are on both sides in FIG. 4. For instance, some of the I/O pads have solder balls 210' that are located on the top side in FIG. 4, whereas the MCU and passive components are located on the bottom side.

Figure 5A:
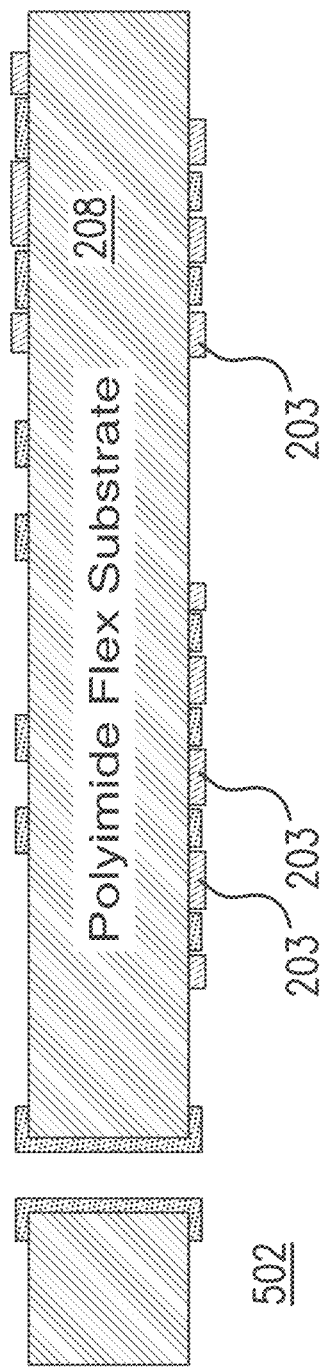
FIGS. 5A to 5D illustrate stages of manufacture of a flex circuit assembly according to an embodiment.
Figure 5B:
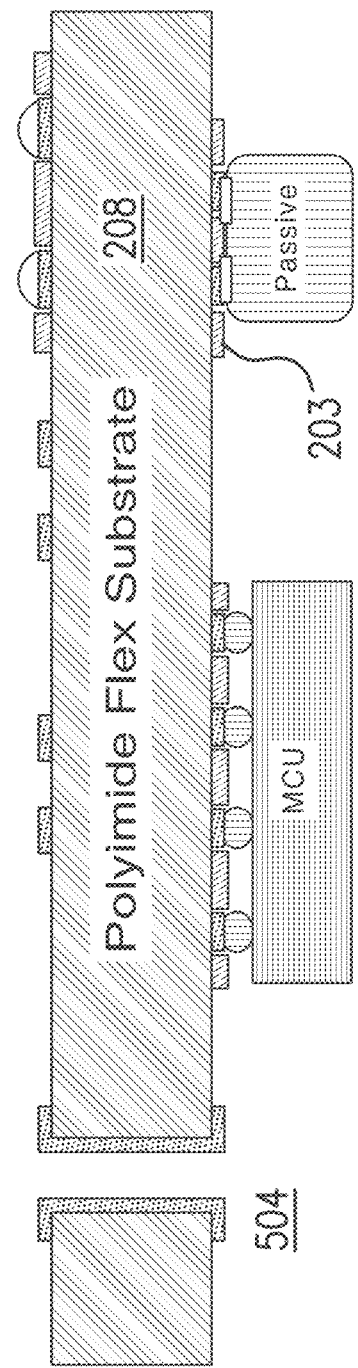
Figure 5C:
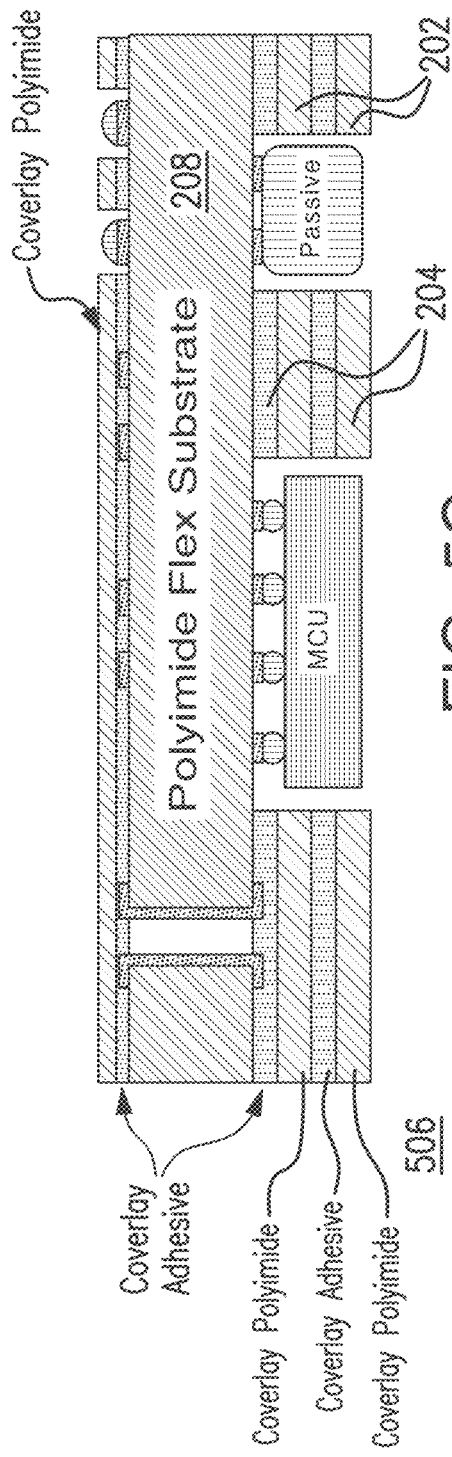
Figure 5D:
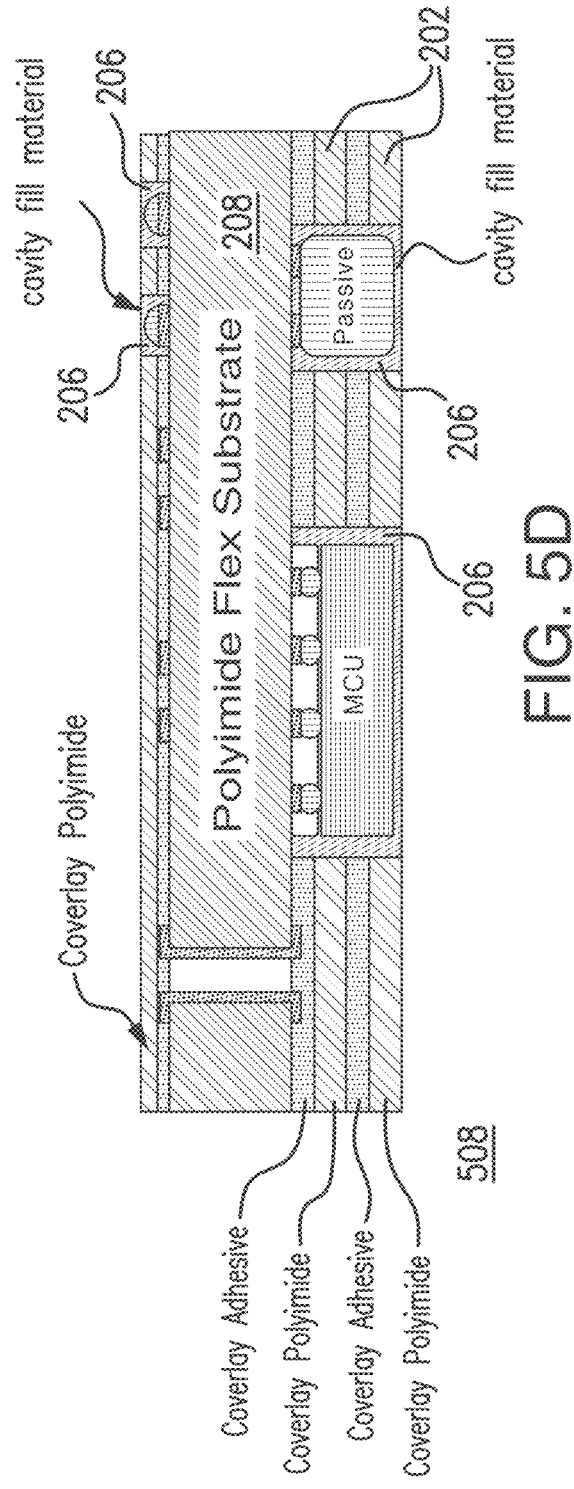

FIGS. 5A-5D show the planarized flex circuit assembly at various stages of manufacture, according to an embodiment. In this embodiment, the assembly of components and solder balls occurs prior to application of the solder mask. This lends itself to a situation where the flex circuit manufacturer manufactures both the flex substrate 208 and performs the assembly, since flex manufacturers commonly apply coverlay, whereby standard assembly houses/OSATs typically do not. At stage 502 in FIG. 5A, the flex substrate 208 is provided, and a solder mask 203 may be applied as needed for assembly, to act as a solder dam to prevent solder spreading and shorting between pads in an array (i.e. solder bridging). At stage 504 in FIG. 5B, the circuitry components are added, such as the MCU, solder domes (or solder balls or SMT copper posts, etc.), and other components, such as passive components. These may be added, in embodiments, to only one side of the flex substrate or to both the top and bottom sides as shown in FIG. 5B. At stage 506 in FIG. 5C, polyimide coverlay layers 202 are provided, with coverlay adhesive 204 provided on one side of each of the coverlay layers 202. The layers create a planarized surface on the top and bottom surfaces of the FPCA. At stage 508 in FIG. 5D, optional cavity fill material 206 is dispensed and cured (e.g., thermally cured, UV cured, or a combination of the two, depending on the nature of the materials used). For example, such cavity fill material may include materials having a desirable glass transition temperature ($T_g$) and/or melt temperature ($T_m$), e.g. having a compressive modulus at least as great as PVC. The fill material may also include flexibilized and/or toughened epoxies, modified acrylics, encapsulants, and/or adhesives. The cavity fill material may contain fillers to modify its properties, such as to reduce its coefficient of thermal expansion to better match PVC, or to minimize shrinkage during curing. In some embodiments, the encapsulant surface may be slightly below or slightly above the coverlay surface. In another embodiment, an alternative process flow may be used, whereby the coverlay is patterned and laminated to the flex substrate 208 before the components are assembled to it. In this embodiment, the SMT component assembly may be performed at the FPC substrate manufacturer, or at an OSAT.

A proposed process flow to level the three-dimensional surface topography of the flex—to form a "planarized" flex—would be:

(1) Flex circuit fabrication to pattern conductor traces and pads on one or both sides. Apply and pattern a thin solder mask as needed for component assembly. Flex circuit substrates can be processed in roll-to-roll format (reel processing). Rigid PCBs are typically processed in panels—standardized formats for a given PCB manufacturer that are larger than the final printed circuit. In typical cases, as would be the case here, there are many individual units (printed circuits) processed in parallel in a panel. Common rigid PCB panel formats are 18"×24", 20×24", or metric sizes close to these (400×450 mm, 400×500 mm, etc.). Flexible printed circuits are often also processed in panel format as well, although the panels are often smaller than for rigid PCBs, since handling of the flexible panels is more challenging, and the dimensional instability of flex circuits is typically greater than in rigid panels (i.e., it is harder to repeatably control the shrinkage or expansion of the panel throughout processing).

(2) Assemble components to FPC substrate, such as passive components, MCU, etc. This step can be performed in panel format, if processing of the flex substrate is performed in in panel format. Flex can also be assembled in roll-to-roll format (reel processing) at a limited number of manufacturers. Roll-to-roll processed FPC substrates can also be cut into strips for component assembly, and the infrastructure for assembling in strip or panel format is larger than exists for roll-to-roll or reel-to-reel assembly.

(3) Pre-pattern openings in coverlay sheets.

(4) Layup appropriate coverlay layers on either side of assembled flex circuit. In doing so, ensure in stack-up that press plates of a flatbed press will not bottom out on components during the lamination process by incorporating appropriate coverlay thicknesses in stack.

(5) Laminate coverlay to FPCA in a lamination press, e.g. such as a vacuum press, a vacuum flatbed press, a 'quicklam' press, or an autoclave.

(6) Optional: Return to surface mount technology (SMT) line and dispense appropriate material in an appropriate volume to fill cavities. Alternatively, cavity fill can be performed at the FPC substrate manufacturer directly following coverlay lamination. Cure fill material (e.g., thermally cure, UV cure, or a combination of both, or in the case of some silicone materials, via exposure to humidity). This fill material is optional. In the case of passive components, it may not be necessary. In the case of, for example, IC packages or WL-CSP packages, underfilling the BGA array of solder balls just after SMT assembly may be sufficient to protect the die and its interconnections to the FPCA. In the absence of filling these openings (cavities) in the coverlay, the circuit could be considered predominately planar, with some areas around components which are recessed from the coverlay surface.

An alternative process flow, with steps similar to that described above, may be as follows:

(1). Flex circuit fabrication.
(2) Pre-pattern openings in coverlay sheets.
(3) Align and layup pre-patterned coverlay layer(s) to FPCA.
(4) Laminate coverlay to FPCA.
(5) Assemble components.
(6) Optional cavity fill, for example by dispensing an appropriate amount of encapsulant into each cavity.

This coverlay approach to leveling the topography of the FPCA inlay can simplify the prelam fabrication process, and has several advantages. Only a center PVC core of appropriate thickness need be punched or milled to provide an opening that fits the finished flex inlay. A thin sheet of unpatterned PVC could be incorporated on either side of the PVC after the flex is placed in the opening of the core. Because of the FPCA inlay has been planarized, the approach may use standard prelam lamination techniques.

In some embodiments, the planarized flex circuit assembly may be designed to reduce the height of components above the flex layer. For instance, components may be assembled through (e.g., solder-paste filled) openings in the flex substrate to back side metal. A one metal layer flex substrate may include un-plated vias through polyimide. Solder balls may be mounted in polyimide openings, which reduces solder ball thickness by somewhat less than the thickness of the flex substrate. The flex polyimide may act in place of a solder mask to contain the solder paste and solder balls when they melt during assembly. A two metal layer flex substrate could have plated or un-plated vias through polyimide, the latter providing similar reduction in effective solder ball height above the FPC surface. In some embodiments, the MCU and passive components may be SMT mounted in this manner, to opposite side metal using central flex polyimide as the solder mask.

Figure 6:
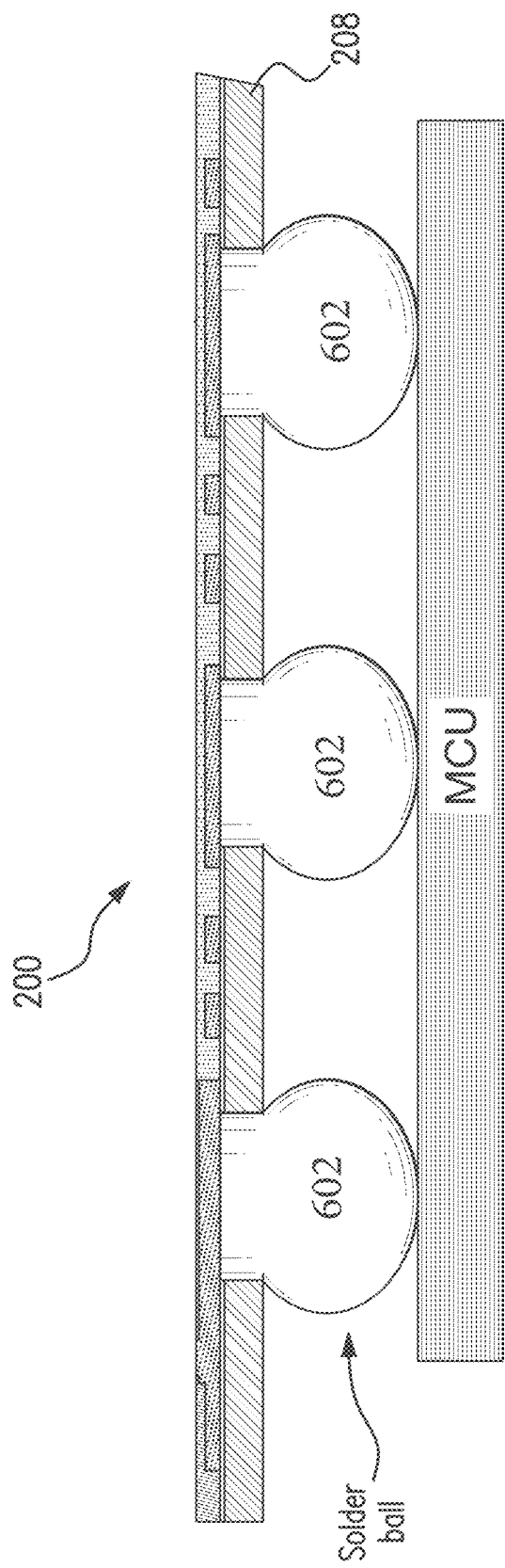
FIG. 6 illustrates a flex circuit assembly according to embodiments.

FIG. 6 illustrates interconnecting solder balls 602 of wafer level, chip scale MCU package to the metal layer on the opposite side of the FPCA 200 from which the component (as shown in FIG. 6, an MCU) is located. In this example, the flex substrate 208 includes vias (plated or unplated) that fill with solder from MCU BGA solder balls and any solder paste used, reducing MCU stand-off height above the flex.

Figure 7A:
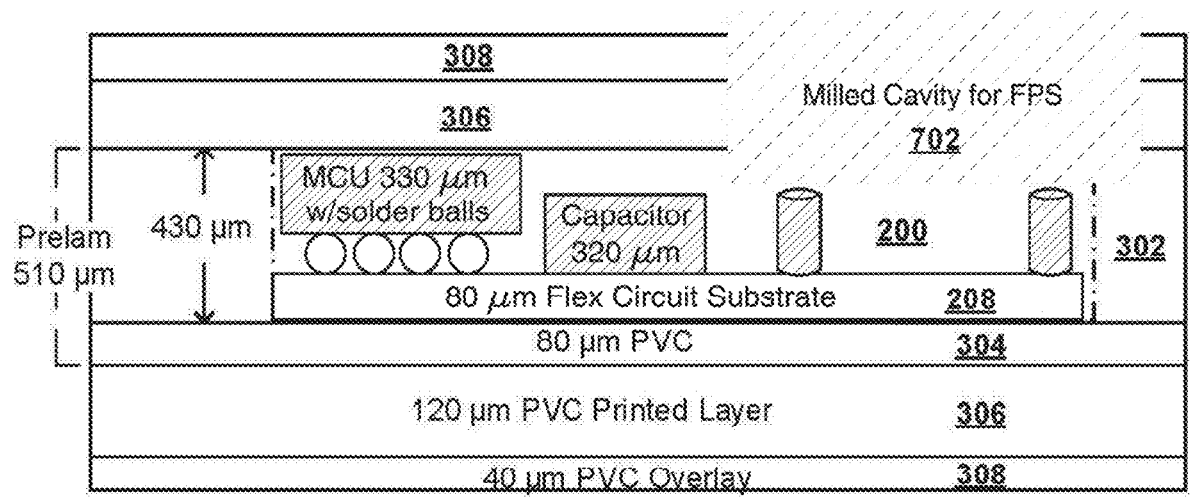
FIGS. 7A and 7B illustrate a multi-layer smart card according to embodiments.
Figure 7B:
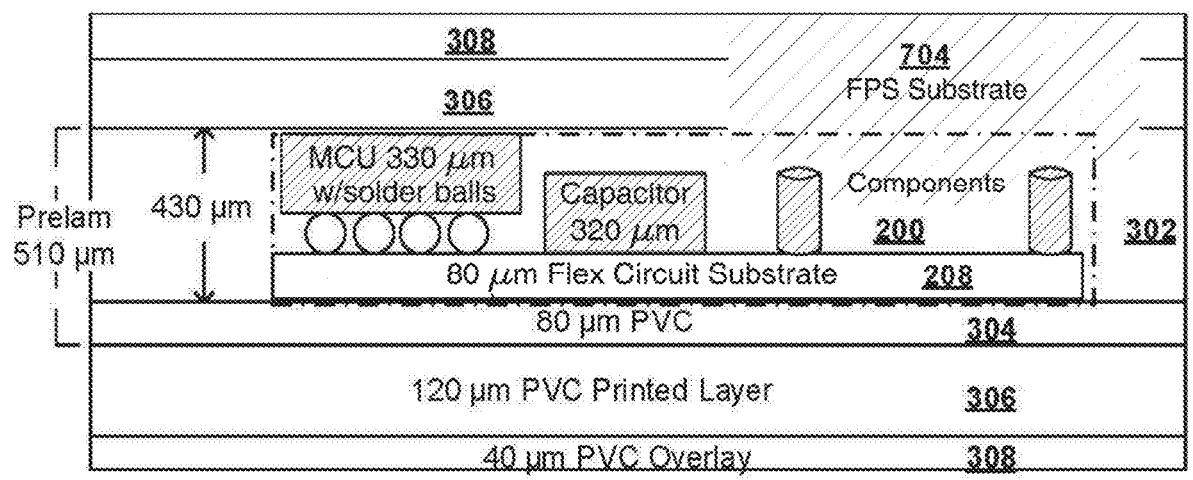

FIGS. 7A and 7B illustrate a cold-lamination approach to a single side FPC assembly. Exemplary thicknesses are shown in the figures, but layers may have different thicknesses than shown. During manufacturing, there may be a cavity milled out of the card to create a milled cavity 702. This milled cavity may provide space for a sensor or component, such as FPS substrate 704. In some embodiments, there may be milled cavities for other components also, such as for an EMV module. In other embodiments, the sensor and/or the EMV module may be assembled to the FPC prior to card cold-lamination, and the top layers of the card (e.g., prelam cap layer, printed layer, overlay) may have one or more cavities pre-punched or milled to accommodate the module(s).

Figure 8A:
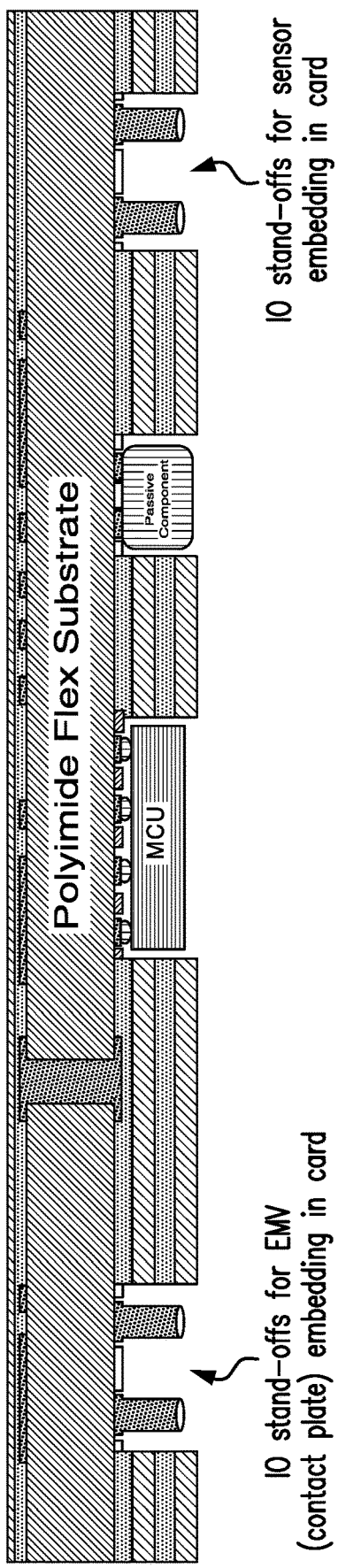
FIGS. 8A and 8B illustrate a flex circuit assembly according to embodiments.
Figure 8B:
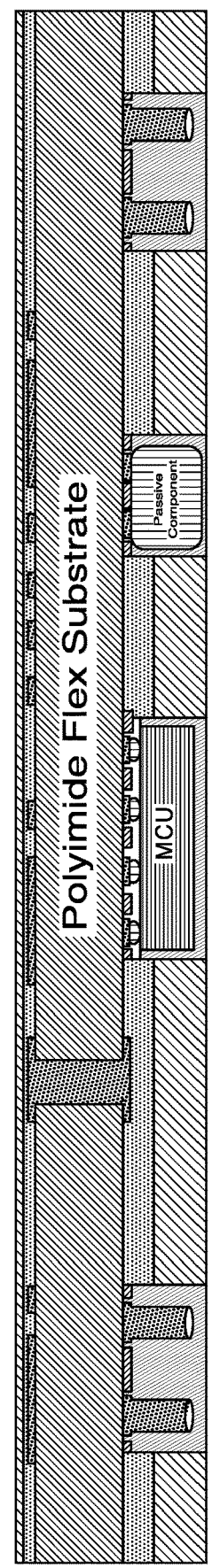

FIGS. 8A and 8B illustrate additional embodiments of an FPCA. As shown in FIG. 8A, the clearance cavities in the coverlay are not filled after component assembly. As shown in FIG. 8B, a single layer of coverlay (one layer each of the adhesive and the film (e.g. polyimide) is used. A single layer of coverlay may be sufficient, for example, if the components are low profile and/or a thicker coverlay is sourced.

Figure 9A:
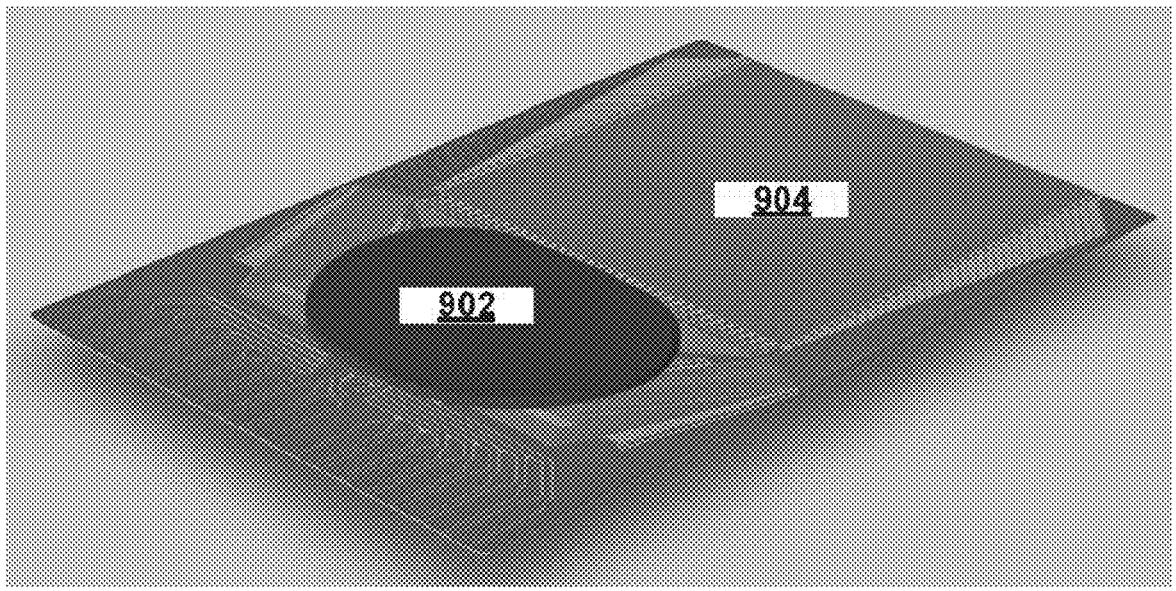
FIGS. 9A and 9B illustrate embodiments where a fingerprint sensor is an integral part of a 2-metal layer flex inlay.
Figure 9B:
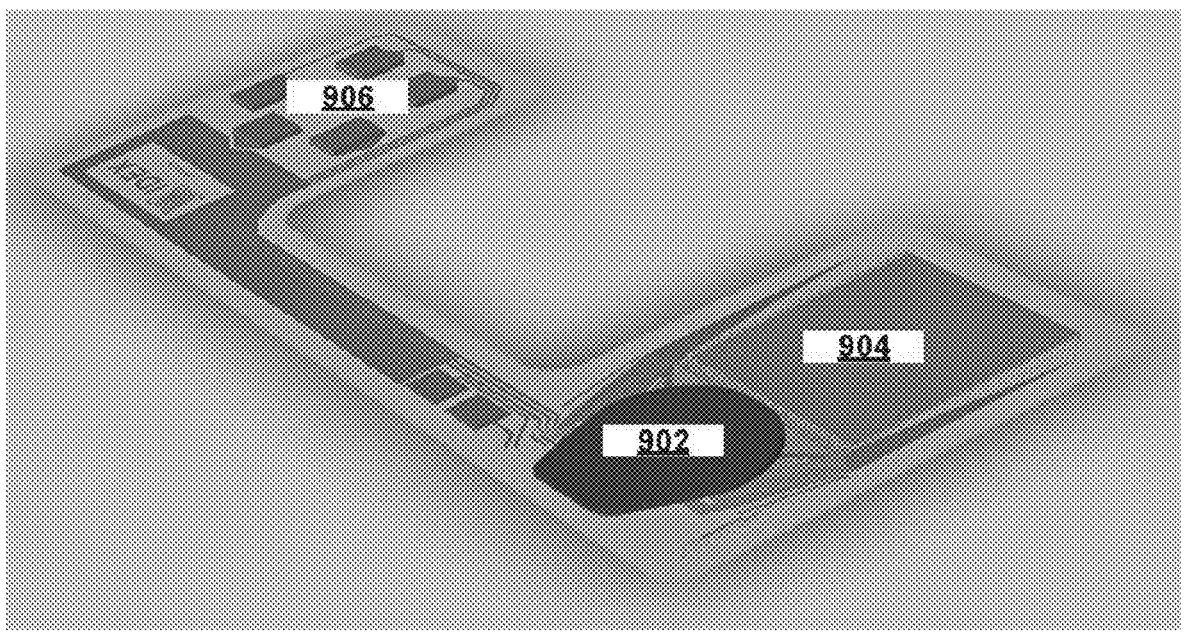

FIGS. 9A and 9B illustrate embodiments where a fingerprint sensor is an integral part of a 2-metal layer flex inlay. In both figures, the sensing area is on the right side. In this example, the ASIC is wire bonded to the flex substrate, and that plus any surface mounted components are encapsulated (shown at 902). The ASIC can be attached by flip chip or other means, in which case encapsulation as shown would not necessarily be needed.

FIG. 9A shows a sensing region 904 plus affiliated components adjacent to it (and encapsulated). FIG. 9B includes those two regions plus an integral 'interconnect' flex 906 that provides a connection between the sensor and the EMV module/contact plate. One intent of this structure is to bury it within the card, so that the sensing elements are below a layer of PVC. It would not be desirable to put thick coverlay over the sensing surface of the FPCA sensor, but if the components are on the opposite side from the sensing surface, a thick coverlay could be used to planarize that side of the FPCA. The side with the sensing surface could just have a thin solder mask or coverlay to protect the circuits, and would already be planar (no components on that side). In FIGS. 9A and 9B, the sensing surface of the sensor integral to the FPCA is on the bottom side of the flex as drawn.

The drawings described above are not to scale. For example, sensor and EMV sizes in X and Y dimensions are typically larger relative to other components than shown in the drawings. IO stand-off plates are much longer and wider than they are tall. In the case of IO stand-off plates for the sensors, in some embodiments sizes may be about ~1.7 mm×3.5 mm in x and y dimensions, and about ~350 µm in height. This may vary from design to design. Also, a fingerprint sensor (FPS) is typically significantly larger than an EMV module (for example, 16.2 mm×16.2 mm for some IDEX FPS's vs. ~9.25 mm×9.62 mm for a common EMV module size). The flex substrate polyimide is commonly about 25 µm to 50 µm thick, and the MCU solder balls could be 300 µm or 400 µm in diameter.

CONCISE DESCRIPTION OF VARIOUS EMBODIMENTS

1. A method for manufacturing a flex inlay, the method comprising:
    providing a flexible printed circuit having opposed surfaces;
    attaching components to a surface of the flexible printed circuit; and
    applying a coverlay over at least one surface of the flexible printed circuit, wherein the coverlay is patterned to not cover any components attached to the surface of the flexible printed circuit;
    wherein the coverlay at least in part forms an essentially planar surface of the flex inlay.

2. The method of embodiment 1, wherein the components comprise one or more of: an antenna, a microcontroller unit (MCU), an application-specific integrated circuit (ASIC), a passive element, an interconnection (IO) stand-off structure; and a secure element.

3. The method of embodiment 2, wherein the components are attached to the surface of the flexible printed circuit with solder and/or conductive adhesive.

4. The method of any one of embodiments 1-3, further comprising dispensing a fill material to fill voids between the attached components and the outer surface of the coverlay, and wherein the essentially planar surface of the flex inlay is further formed by the fill material.

5. The method of embodiment 4, further comprising curing the fill material, and wherein a surface of the fill material, after curing, is essentially flush with, proud of, or below a surface of the coverlay.

6. The method of any one of embodiments 1-5, wherein attaching components to a surface of the flexible printed circuit occurs before applying a coverlay over at least one surface of the flexible printed circuit.

7. The method of any one of embodiments 1-6, wherein attaching components to a surface of the flexible printed circuit occurs after applying a coverlay over at least one surface of the flexible printed circuit.

8. The method of embodiment 7, wherein an adhesive used in applying the coverlay over at least one surface of the flexible printed circuit is compatible with high temperatures (e.g. lead-free solder reflow temperatures).

9. The method of any one of embodiments 1-8, wherein the height of an outer surface of the coverlay above the surface of the flexible printed circuit is at least as great as the height any attached components above the surface of the flexible printed circuit.

10. The method of any one of embodiments 1-9, wherein the essentially planar surface of the flex inlay is fully planar.

11. The method of any one of embodiments 1-8, wherein one or more of the components protrudes above the essentially planar surface of the flex inlay by an amount that less than what would be feasible with a solder mask in place of the coverlay on the surface of the flexible printed circuit.

12. The method of any one of embodiments 1-11, wherein attaching components to a surface of the flexible printed circuit comprises attaching components to only one surface of the flexible printed circuit.

13. The method of any one of embodiments 1-11, wherein attaching components to a surface of the flexible printed circuit comprises attaching components to both surfaces of the flexible printed circuit.

14. The method of embodiment 13, wherein applying a coverlay over at least one surface of the flexible printed circuit comprises applying coverlay over both surfaces of the flexible printed circuit.

15. The method of any one of embodiments 1-14, wherein the coverlay comprises two or more layers on each of the at least one surface of the flexible printed circuit that it is applied to.

16. The method of any one of embodiments 1-15, wherein the coverlay comprises a film with a partially cured layer of thermoset adhesive on one surface of the film, wherein the film is made of one or more of polyimide, polyethylene terephthalate (PET), and polyethylene naphthalate (PEN).

17. The method of any one of embodiments 1-16, wherein the fill material comprises one or more of (i) a material having a compressive modulus at least as great as polyvinyl chloride (PVC), (ii) a low modulus thermoset material, (iii) a modified epoxy, (iv) a modified acrylic, (v) an epoxy blend (e.g., containing fluoropolymers, silicones, or other polymers), (vi) a material that is thermally curable, UV curable, or curable by a combination of thermal and UV, (vii) a material having a flexural modulus similar to PVC, (viii) a material having a compressive modulus between 3 GPa and 10 GPa, (ix) a material having a flexural modulus between 1 GPa and 10 GPa, and (x) a material having a flexural modulus between 2 GPa and 5 GPa.

18. The method of any one of embodiments 1-17, wherein the flexible printed circuit has a base dielectric material comprising one or more of polyimide, polyethylene terephthalate (PET), and polyethylene naphthalate (PEN); and has a conductor material comprising one or more of copper, aluminum, and a conductive ink.

19. The method of any one of embodiments 1-18, further comprising applying a solder mask prior to applying the coverlay, wherein the solder mask is under the coverlay.

20. A flex inlay comprising:
a flexible printed circuit having opposed surfaces;
components attached to a first surface of the flexible printed circuit, the first surface being one of the opposed surfaces;
a coverlay over at least one surface of the flexible printed circuit, wherein the coverlay is patterned to not cover any components attached to the first surface of the flexible printed circuit;
wherein the coverlay at least in part forms an essentially planar surface of the flexible printed circuit.

21. The flex inlay of embodiment 20, wherein the components comprise one or more of: an antenna, a microcontroller unit (MCU), an application-specific integrated circuit (ASIC), a passive element, an interconnection (IO)) stand-off structure; and a secure element.

22. The flex inlay of embodiment 21, wherein the components are attached to the first surface of the flexible printed circuit with solder and/or conductive adhesive.

23. The flex inlay of any one of embodiments 20-22, further comprising a fill material dispensed in voids between the attached components and the outer surface of the coverlay openings, and wherein the essentially planar surface of the flex inlay is further formed by the fill material.

24. The flex inlay of embodiment 23, wherein the fill material is cured and a surface of the fill material is essentially flush with, proud of, or below a surface of the coverlay.

25. The flex inlay of any one of embodiments 20-23, wherein the height of an outer surface of the coverlay above the first surface of the flexible printed circuit is at least as great as the height any attached components above the first surface of the flexible printed circuit.

26. The flex inlay of any one of embodiments 20-25, wherein the essentially planar surface of the flex inlay is fully planar.

27. The flex inlay of any one of embodiments 20-24, wherein one or more of the components protrudes above the essentially planar surface of the flex inlay by an amount that less than what would be feasible with a solder mask in place of the coverlay on the first surface of the flexible printed circuit.

28. The flex inlay of any one of embodiments 20-27, wherein components attached to the first surface of the flexible printed circuit are attached to only one surface of the flexible printed circuit.

29. The flex inlay of any one of embodiments 20-27, wherein components attached to the first surface of the flexible printed circuit comprise components attached to both surfaces of the flexible printed circuit.

30. The flex inlay of embodiment 29, wherein the coverlay over the first surface of the flexible printed circuit comprises a coverlay over both surfaces of the flexible printed circuit.

31. The flex inlay of any one of embodiments 20-30, wherein the coverlay comprises two or more layers on one or more of the at least the first surface of the flexible printed circuit.

32. The flex inlay of any one of embodiments 20-31, wherein the coverlay comprises a film with a partially cured layer of thermoset adhesive on one surface of the film, wherein the film is made of one or more of polyimide, polyethylene terephthalate (PET), and polyethylene naphthalate (PEN).

33. The flex inlay of any one of embodiments 20-32, wherein the fill material comprises one or more of (i) a material having a compressive modulus at least as great as polyvinyl chloride (PVC), (ii) a low modulus thermoset material, (iii) a modified epoxy, (iv) a modified acrylic, (v) an epoxy blend (e.g., containing fluoropolymers, silicones, or other polymers), (vi) a material that is thermally curable, UV curable, or curable by a combination of thermal and UV, (vii) a material having a flexural modulus similar to PVC, (viii) a material having a compressive modulus between 3 GPa and 10 GPa, (ix) a material having a flexural modulus between 1 GPa and 10 GPa, and (x) a material having a flexural modulus between 2 GPa and 5 GPa.

34. The flex inlay of any one of embodiments 20-33, wherein the flexible printed circuit has a base dielectric material comprising one or more of polyimide, polyethylene terephthalate (PET), and polyethylene naphthalate (PEN)); and has a conductor material comprising one or more of copper, aluminum, and a conductive ink.

35. The flex inlay of any one of embodiments 20-34, further comprising a solder mask under the coverlay.

While the subject matter of this disclosure has been described and shown in considerable detail with reference to certain illustrative embodiments, including various combinations and sub-combinations of features, those skilled in the art will readily appreciate other embodiments and variations and modifications thereof as encompassed within the scope of the present disclosure. Moreover, the descriptions of such embodiments, combinations, and sub-combinations is not intended to convey that the subject matter requires features or combinations of features other than those expressly recited in any claims supported by this disclosure.

The invention claimed is:

1. A method for manufacturing a flex inlay having an essentially planar surface, the method comprising:
providing a flexible printed circuit having opposed first and second surfaces;
attaching components to the first surface of the flexible printed circuit; and
applying a coverlay over at least the first surface of the flexible printed circuit, wherein the coverlay is patterned to not cover any components attached to the first surface of the flexible printed circuit;
wherein the coverlay at least in part forms the essentially planar surface of the flex inlay.

2. The method of claim 1, wherein the components comprise one or more of: an antenna, a microcontroller unit (MCU), an application-specific integrated circuit (ASIC), a passive element, an interconnection (IO) stand-off structure; and a secure element.

3. The method of claim 2, wherein the components are attached to the first surface of the flexible printed circuit with solder and/or conductive adhesive.

4. The method of claim 1, further comprising dispensing a fill material to fill voids between the attached components and the outer surface of the coverlay, and wherein the essentially planar surface of the flex inlay is further formed by the fill material.

5. The method of claim 4, further comprising curing the fill material, and wherein a surface of the fill material, after curing, is essentially flush with, proud of, or below a surface of the coverlay.

6. The method of claim 1, wherein attaching components to the first surface of the flexible printed circuit occurs before applying a coverlay over at least the first surface of the flexible printed circuit.

7. The method of claim 1, wherein attaching components to the first surface of the flexible printed circuit occurs after applying a coverlay over at least the first surface of the flexible printed circuit.

8. The method of claim 7, wherein an adhesive used in applying the coverlay over at least the first surface of the flexible printed circuit is compatible with high temperatures.

9. The method of claim 1, wherein the height of an outer surface of the coverlay above the first surface of the flexible printed circuit is at least as great as the height any attached components above the first surface of the flexible printed circuit.

10. The method of claim 1, wherein the essentially planar surface of the flex inlay is fully planar.

11. The method of claim 1, wherein one or more of the components protrudes above the essentially planar surface of the flex inlay by an amount that is less than what would be feasible with a solder mask in place of the coverlay on the first surface of the flexible printed circuit.

12. The method of claim 1, wherein attaching components to the first surface of the flexible printed circuit comprises attaching components to only the first surface of the flexible printed circuit.

13. The method of claim 1, wherein attaching components to the first surface of the flexible printed circuit comprises attaching components to both the first and second surfaces of the flexible printed circuit.

14. The method of claim 13, wherein applying a coverlay over at least the first surface of the flexible printed circuit comprises applying coverlay over both the first and second surfaces of the flexible printed circuit.

15. The method of claim 1, wherein the coverlay comprises two or more layers on each of the at least the first surface of the flexible printed circuit that it is applied to.

16. The method of claim 1, wherein the coverlay comprises a film with a partially cured layer of thermoset adhesive on one surface of the film, wherein the film is made of one or more of polyimide, polyethylene terephthalate (PET), and polyethylene naphthalate (PEN).

17. The method of claim 1, wherein the fill material comprises one or more of (i) a material having a compressive modulus at least as great as polyvinyl chloride (PVC), (ii) a low modulus thermoset material, (iii) a modified epoxy, (iv) a modified acrylic, (v) an epoxy blend (e.g., containing fluoropolymers, silicones, or other polymers), (vi) a material that is thermally curable, UV curable, or curable by a combination of thermal and UV, (vii) a material having a flexural modulus similar to PVC, (viii) a material having a compressive modulus between 3 GPa and 10 GPa, (ix) a material having a flexural modulus between 1 GPa and 10 GPa, and (x) a material having a flexural modulus between 2 GPa and 5 GPa.

18. The method of claim 1, wherein the flexible printed circuit has a base dielectric material comprising one or more of polyimide, polyethylene terephthalate (PET), and polyethylene naphthalate (PEN); and has a conductor material comprising one or more of copper, aluminum, and a conductive ink.

19. The method of claim 1, further comprising applying a solder mask prior to applying the coverlay, wherein the solder mask is under the coverlay.

20. A flex inlay comprising:
   a flexible printed circuit having opposed first and second surfaces;
   components attached to the first surface of the flexible printed circuit, the first surface being one of the opposed first and second surfaces;
   a coverlay over at least the first surface of the flexible printed circuit, wherein the coverlay is patterned to not cover any components attached to the first surface of the flexible printed circuit;
   wherein the flex inlay has an essentially planar surface and the coverlay at least in part forms the essentially planar surface of the flex inlay.

21. The flex inlay of claim 20, wherein the components comprise one or more of: an antenna, a microcontroller unit (MCU), an application-specific integrated circuit (ASIC), a passive element, an interconnection (10) stand-off structure; and a secure element.

22. The flex inlay of claim 21, wherein the components are attached to the first surface of the flexible printed circuit with solder and/or conductive adhesive.

23. The flex inlay of claim 20, further comprising a fill material dispensed in voids between the attached components and the outer surface of the coverlay openings, and wherein the essentially planar surface of the flex inlay is further formed by the fill material.

24. The flex inlay of claim 23, wherein the fill material is cured and a surface of the fill material is essentially flush with, proud of, or below a surface of the coverlay.

25. The flex inlay of claim 20, wherein the height of an outer surface of the coverlay above the first surface of the flexible printed circuit is at least as great as the height any attached components above the first surface of the flexible printed circuit.

26. The flex inlay of claim 20, wherein the essentially planar surface of the flex inlay is fully planar.

27. The flex inlay of claim 20, wherein one or more of the components protrudes above the essentially planar surface of the flex inlay by an amount that less than what would be feasible with a solder mask in place of the coverlay on the first surface of the flexible printed circuit.

28. The flex inlay of claim 20, wherein components attached to the first surface of the flexible printed circuit are attached to only one surface of the flexible printed circuit.

29. The flex inlay of claim 20, wherein components attached to the first surface of the flexible printed circuit comprise components attached to both surfaces of the flexible printed circuit.

30. The flex inlay of claim 29, wherein the coverlay over the first surface of the flexible printed circuit comprises a coverlay over both surfaces of the flexible printed circuit.

31. The flex inlay of claim 20, wherein the coverlay comprises two or more layers on one or more of the at least the first surface of the flexible printed circuit.

32. The flex inlay of claim 20, wherein the coverlay comprises a film with a partially cured layer of thermoset adhesive on one surface of the film, wherein the film is made of one or more of polyimide, polyethylene terephthalate (PET), and polyethylene naphthalate (PEN).

33. The flex inlay of claim 20, wherein the fill material comprises one or more of (i) a material having a compressive modulus at least as great as polyvinyl chloride (PVC), (ii) a low modulus thermoset material, (iii) a modified epoxy, (iv) a modified acrylic, (v) an epoxy blend (e.g., containing fluoropolymers, silicones, or other polymers), (vi) a material that is thermally curable, UV curable, or curable by a combination of thermal and UV, (vii) a material having a flexural modulus similar to PVC, (viii) a material having a compressive modulus between 3 GPa and 10 GPa, (ix) a material having a flexural modulus between 1 GPa and 10 GPa, and (x) a material having a flexural modulus between 2 GPa and 5 GPa.

34. The flex inlay of claim 20, wherein the flexible printed circuit has a base dielectric material comprising one or more of polyimide, polyethylene terephthalate (PET), and polyethylene naphthalate (PEN)); and has a conductor material comprising one or more of copper, aluminum, and a conductive ink.

35. The flex inlay of claim 20, further comprising a solder mask under the coverlay.

\* \* \* \* \*